(12) United States Patent
Yune et al.

(10) Patent No.: US 8,698,233 B2
(45) Date of Patent: Apr. 15, 2014

(54) BURIED WORD LINE AND CONNECTION PAD FOR MEMORY DEVICE

(71) Applicant: SK Hynix Inc., Gyeonggi-do (KR)

(72) Inventors: Hyoung Soon Yune, Seoul (KR); Joo Hong Jeong, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/705,678

(22) Filed: Dec. 5, 2012

(65) Prior Publication Data
US 2013/0093007 A1    Apr. 18, 2013

Related U.S. Application Data

(62) Division of application No. 12/647,918, filed on Dec. 28, 2009, now Pat. No. 8,338,253.

(30) Foreign Application Priority Data

Sep. 30, 2009  (KR) .................. 10-2009-0093117

(51) Int. Cl.
*H01L 29/66* (2006.01)
*H01L 21/336* (2006.01)

(52) U.S. Cl.
USPC ............ 257/330; 257/E21.656; 257/E21.659; 257/E21.66; 438/259; 438/585

(58) Field of Classification Search
None
See application file for complete search history.

(56) References Cited

U.S. PATENT DOCUMENTS

| | | | |
|---|---|---|---|
| 7,595,262 B2 | 9/2009 | Schlosser | |
| 7,928,504 B2* | 4/2011 | Choi | 257/326 |
| 7,998,870 B2* | 8/2011 | Nam | 438/700 |
| 8,053,316 B2 | 11/2011 | Kim et al. | |
| 8,093,125 B2* | 1/2012 | Kim | 438/259 |
| 8,338,253 B2* | 12/2012 | Yune et al. | 438/259 |
| 2005/0014338 A1 | 1/2005 | Kim et al. | |
| 2010/0270602 A1* | 10/2010 | Choi | 257/296 |
| 2011/0049595 A1 | 3/2011 | Xiao | |
| 2012/0100705 A1 | 4/2012 | Xiao | |
| 2013/0244413 A1* | 9/2013 | Lee et al. | 438/589 |

FOREIGN PATENT DOCUMENTS

| | | | |
|---|---|---|---|
| KR | 1020050008223 A | 1/2005 | |
| KR | 1020060124901 A | 12/2006 | |
| KR | 1020080099482 A | 11/2008 | |
| KR | 1020090074559 A | 7/2009 | |

OTHER PUBLICATIONS

USPTO RR dated May 31, 2012 in connection with U.S. Appl. No. 12/647,918.
USPTO NOA mailed Aug. 29, 2012 in connection with U.S. Appl. No. 12/647,918.

* cited by examiner

*Primary Examiner* — Alonzo Chambliss
(74) *Attorney, Agent, or Firm* — Ladas & Parry LLP (57) ABSTRACT

A method for fabricating a semiconductor memory apparatus is provided to minimize failure of the semiconductor memory apparatus and to secure a processing margin. The method also provides for minimizing the deterioration of an operating speed and the operational stability, and minimizing the increase of resistance occurring as a result of a reduced processing margin when forming a gate pattern in a peripheral region of the semiconductor memory apparatus. The method includes forming a connection pad in a peripheral region while forming a buried word line in a cell region, and forming a gate pattern in the peripheral region while forming a bit line in the cell region.

5 Claims, 8 Drawing Sheets

<CELL REGION>

Fig.2a
<Prior Art>

<I-I'>
<PERIPHERAL REGION>

<II-II'>
<PERIPHERAL REGION>

<CELL REGION>

Fig.5a

<I-I'>
<PERIPHERAL REGION>

Fig.5b

<II-II'>
<PERIPHERAL REGION>

BURIED WORD LINE AND CONNECTION PAD FOR MEMORY DEVICE

CROSS-REFERENCE(S) TO RELATED APPLICATIONS

Priority to Korean Patent Application No. 10-2009-0093117, filed on Sep. 30, 2009, which is incorporated herein by reference in its entirety, is claimed.

BACKGROUND OF THE INVENTION

Exemplary embodiments of the present invention relate to a method for fabricating a highly integrated semiconductor memory apparatus, and more particularly, to a method for fabricating a semiconductor memory apparatus capable of reducing defects by increasing a processing margin when forming transistors in the highly integrated semiconductor memory apparatus.

In general, a semiconductor memory apparatus includes a plurality of unit cells, each of which consists of a capacitor and a transistor. The capacitor is used to temporarily store data, and the transistor is used to transmit data between a bit line and the capacitor in response to a control signal, e.g., a voltage level of a word line, using a property of semiconductor whose electrical conductivity changes depending on the environment. The transistor includes three regions of a gate, a source and a drain, and charge movement between the source and the drain occurs depending on the control signal inputted to the gate. The charge movement between the source and the drain is performed through a channel region.

In case of forming a typical transistor using a semiconductor substrate, a gate is formed on the semiconductor substrate, and a source and a drain are formed by doping impurities into portions of the semiconductor substrate at both sides of the gate. However, as the data storage capacity and the degree of integration of a semiconductor memory apparatus increase, the size of each unit cell is required to be smaller. That is, the design rule of a capacitor and a transistor included in the unit cell has been reduced, and thus a channel length of the cell transistor has been gradually decreased. As a result, a short channel effect and drain induced barrier lower (DIBL) have occurred in the typical transistor, which deteriorated the operational reliability of the transistor. The above drawbacks occurring as a result of the reduction of the channel length can be overcome by maintaining a threshold voltage to allow the cell transistor to perform a normal operation. In general, as the channel length of the transistor has been made smaller, the doping concentration of impurities in a region where a channel is formed has been increased.

However, as the design rule goes less than 100 nm, further increasing the doping concentration in the channel region as much as the extent of the reduction of the design rule increases an electric field in a storage node (SN) junction. As a result, it may cause another drawback that a refresh property of the semiconductor memory apparatus is deteriorated. To overcome this drawback, a cell transistor having a three-dimensional channel structure is employed to maintain a channel length thereof, although the design rule is reduced. In the three-dimensional channel structure, a long channel is formed in a vertical direction. Namely, since the channel length is secured in the vertical direction although a channel width is small in a horizontal direction, the doping concentration may be reduced, and thus the deterioration of the refresh property may be minimized.

Meanwhile, as the degree of integration of the semiconductor memory apparatus is getting higher, the distance between a bit line and a word line that are coupled to the cell transistor becomes smaller. As a result, parasitic capacitance generated between the bit line and the word line increases, and the increasing parasitic capacitance deteriorates an operational margin of a sense amplifier amplifying data transmitted through the bit line. This is fatal to the operational reliability of the semiconductor memory apparatus. In order to solve the above drawbacks, a buried word line structure has been introduced to reduce the parasitic capacitance between the bit line and the word line. In the buried word line structure, the word line is formed only in a recess not over the semiconductor substrate. Hereinafter, a method for fabricating the semiconductor memory apparatus employing the buried word line structure will be described.

Figure 1A:
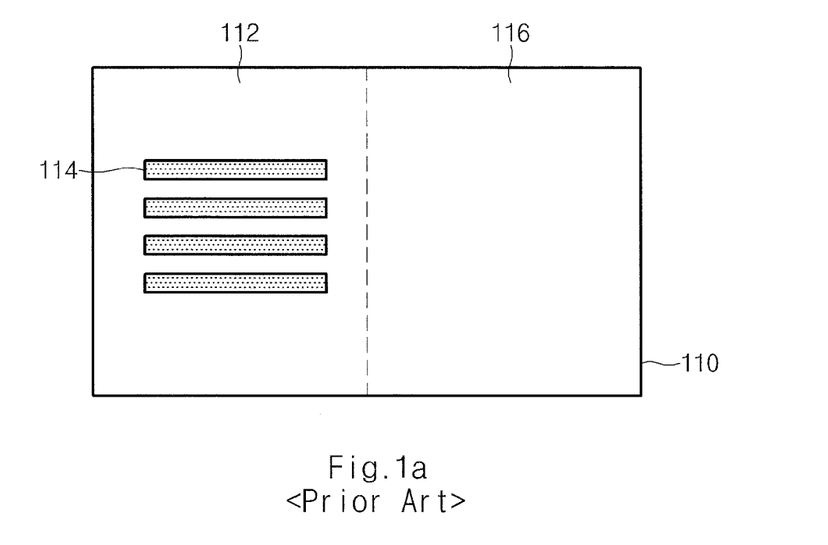
FIGS. 1a and 1b are plane views illustrating masks used in fabricating a typical semiconductor memory apparatus.
Figure 1B:
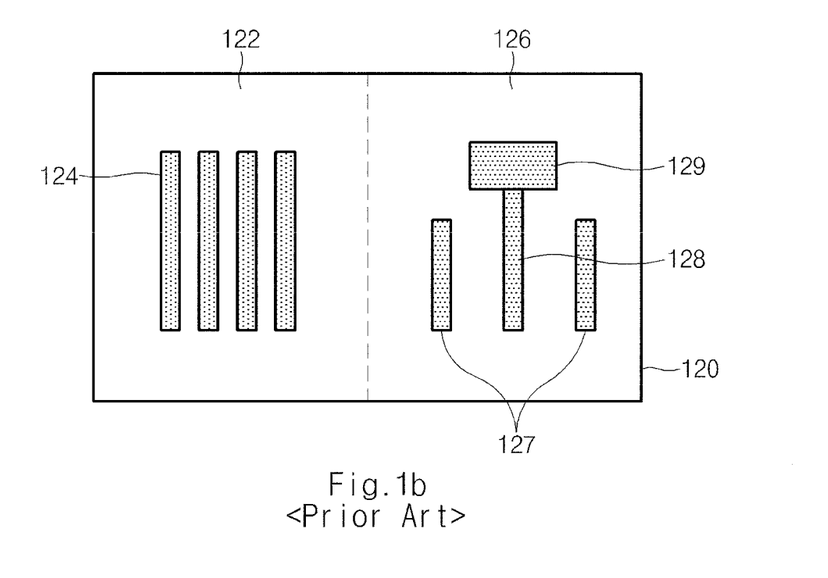

FIGS. 1a and 1b are plane views illustrating masks used in fabricating a typical semiconductor memory apparatus. In particular, FIG. 1a shows a mask 110 defining a buried word line included in a cell region of the semiconductor memory apparatus and FIG. 1b describes a mask 120 defining a gate pattern formed in a peripheral region and a bit line formed in the cell region of the semiconductor memory apparatus.

Referring to FIG. 1a, the buried word line mask 110 includes a first region 112 to define a pattern to be formed in the cell region and a second region 116 to define a pattern to be formed in the peripheral region. The first region 112 includes a plurality of line patterns 114 each of which defines a buried word line, whereas no pattern is defined in the second region 116.

Although it is not shown, in the cell region, after forming an isolation region in a semiconductor substrate using a mask defining an active region, a recess (not shown) is formed in the active region using the buried word line mask 110, and then the buried word line is formed by filling the recess with a conductive material. However, when forming the recess to form the buried word line in the cell region, no pattern is formed in the peripheral region. This is because any transistor including a recess gate or a buried gate is not formed in the peripheral region, and a transistor having a two-dimensional plane channel is formed in the peripheral region.

Referring to FIG. 1b, the bit line and gate pattern mask 120 includes a first region 122 and a second region 126. The first region 122 includes line patterns 124 to define a bit line to be formed in the cell region. The second region 126 includes a first line pattern 128 to define the gate pattern to be formed in the peripheral region, a second line pattern 127 to define a dummy gate pattern, and a pad pattern 129 to define a connection pad coupled to the gate pattern. That is, when fabricating the semiconductor memory apparatus using the bit line and gate pattern mask 120, the bit line included in the cell region and the gate pattern included in the peripheral region are formed at substantially the same height.

Figure 2A:
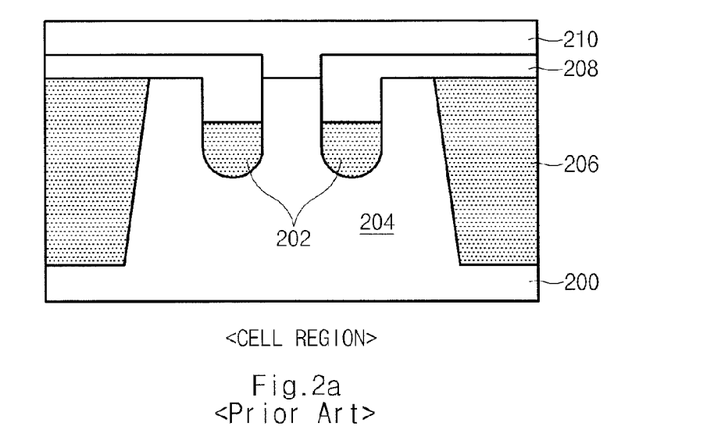
FIGS. 2a and 2d are cross-sectional views and a solid view illustrating the semiconductor memory apparatus fabricated using the masks described in FIGS. 1a and 1b, respectively.
Figure 2B:
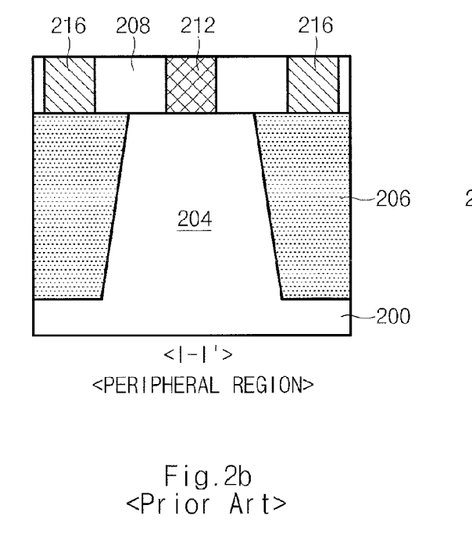

FIGS. 2a and 2b are cross-sectional views and a solid view illustrating the semiconductor memory apparatus fabricated using the masks described in FIGS. 1a and 1b, respectively.

Referring to FIGS. 2a to 2b, in the cell region of the semiconductor memory apparatus, an isolation layer 206 defining an active region 204 is formed in a semiconductor substrate 200, and buried word lines 202 are formed in two recesses that are formed in the active region 204 using the buried word line mask 110. After forming an insulation layer 208 on the buried word lines 202 and the active region 204, a bit line 210 partially coupled to the active region 204 is formed by etching a portion of the insulation layer 208 to partially expose the top surface of the active region 204.

Figure 2C:
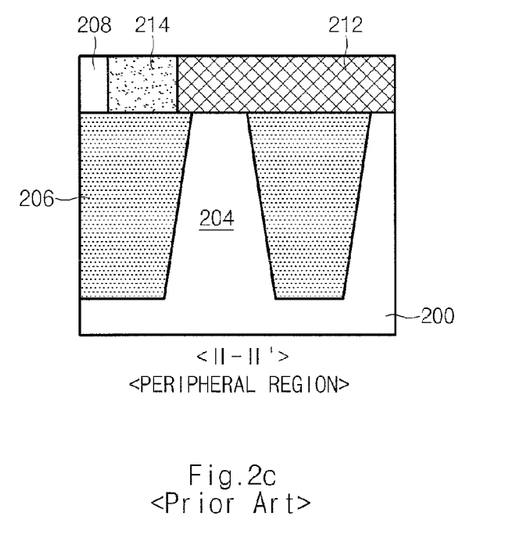
Figure 2D:
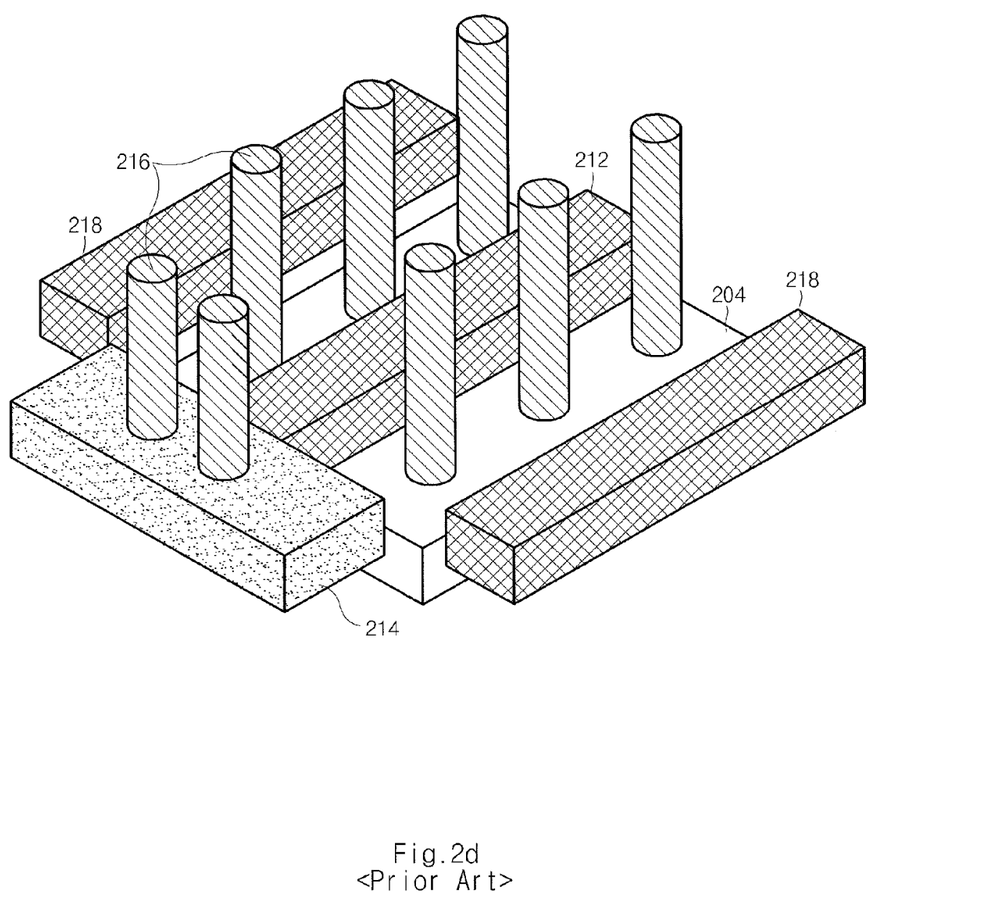

In the meantime, although the isolation layer 206 is also formed in the peripheral region of the semiconductor memory apparatus like in the cell region, a gate pattern 212, not the buried word line 202, is formed on the active region 204 of the peripheral region. Referring to FIG. 2b illustrating a cross-sectional view of the gate pattern 212 in a minor axial direction, i.e., a cross-sectional view taken along an I-I' line, the gate pattern 212 is formed on a two-dimensional plane channel region, and a dummy gate pattern 218 shown in FIG. 2d is formed on the isolation layer 206 in the peripheral region, whereas the buried word line 202 is formed on a three-dimensional channel region in the cell region. Furthermore, referring to FIG. 2c illustrating a cross-sectional view of the gate pattern 212 in a major axial direction, i.e., a cross-sectional view taken along an II-II' line, a connection pad 214 coupled to an end of the gate pattern 212 is formed on the isolation layer 206.

FIG. 2d is a solid view illustrating a transistor included in the peripheral region of the semiconductor memory apparatus. The active region 204 defined by the isolation layer 206 described in FIG. 2a has an island shape. The gate pattern 212 is formed on the active region 204, and the connection pad 214 is formed at the end of the gate pattern 212 to transfer a gate voltage. At this time, the gate pattern 212 and the connection pad 214 formed using the bit line and gate pattern mask 120 are disposed at substantially the same height and constructed with one pattern having a 'T' shape. Since the connection pad 214 and the active region 204 should be a certain distance apart to suppress the generation of the parasitic capacitance and the electrical short, the gate pattern 212 should be formed extending onto the isolation layer 206 as well as onto the active region 204. After then, a plurality of contacts 216 is formed on the active region 204 and the connection pad 214 to transmit signals and data or to supply the gate voltage.

Particularly looking at a process of forming the contacts 216, an inter-layer insulation layer (not shown) is deposited on the gate pattern 212 and the connection pad 214, and contact holes (not shown) are formed and filled with a conductive material. Herein, since a contact hole formed on the connection pad 214 has a depth different from that of a contact hole formed on the active region 204, a processing margin of the contact hole formed on the active region 204 may be reduced, wherein the depth of the contact hole formed on the active region 204 is greater than that of the contact hole formed on the connection pad 214. That is, in case the active region 204 is not fully exposed by the contact hole because the depth of the contact hole formed on the active region 204 is greater, the contact resistance between the active region 204 and the contact 216 may increase.

Figure 3:
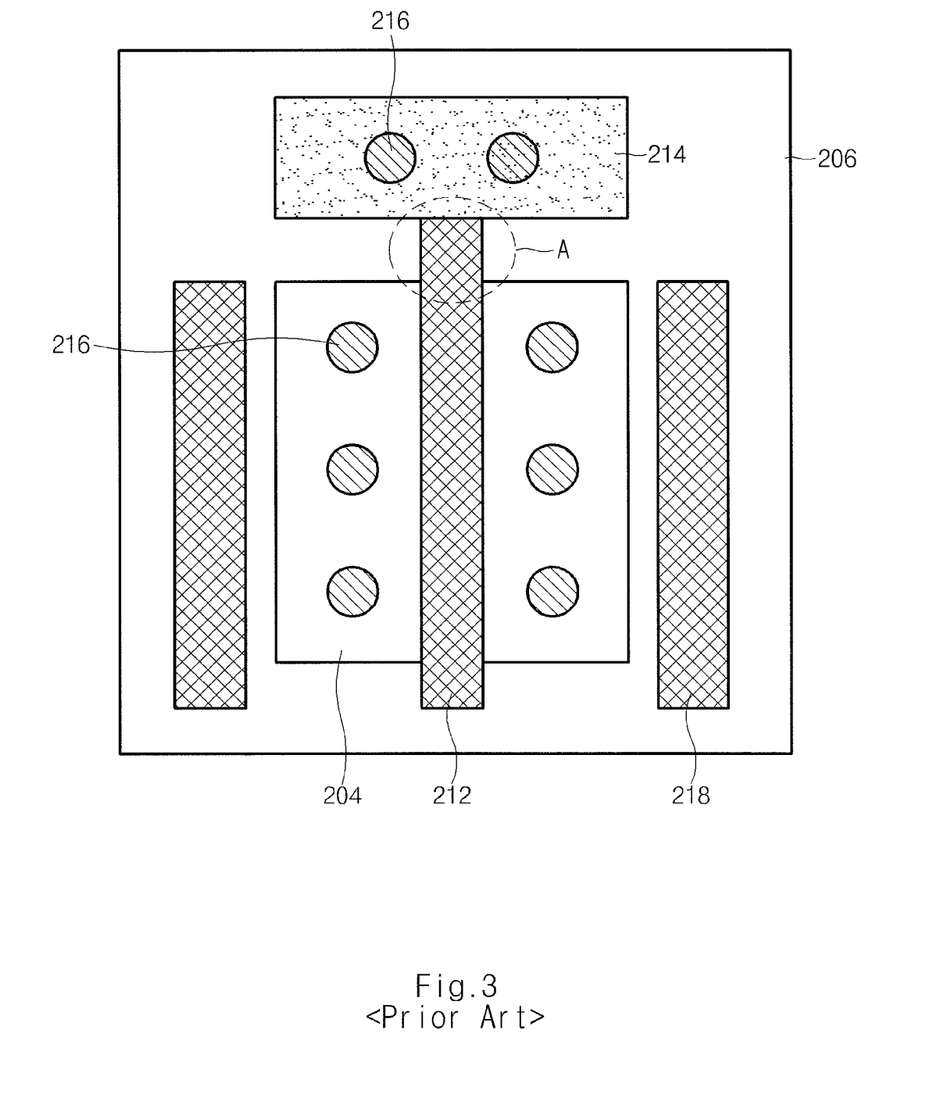
FIG. 3 is a plane view illustrating a transistor described in FIG. 2d.

FIG. 3 is a plane view illustrating the transistor described in FIG. 2D.

Referring to FIG. 3, the active region 204 is defined by the isolation layer 206; the gate pattern 212 is formed on the active region 204; and the connection pad 214 is formed on the isolation layer 206.

Moreover, the plurality of contacts 216 is formed on the active region 204 and the connection pad 214.

The dummy gate patterns 218 are further formed on the isolation layer 206. Recently, as the design rule decreases, the line width of the gate pattern 212 formed in the peripheral region is also reduced. As a result, the processing margin of the gate pattern 212 is decreasing. To overcome this drawback, the dummy gate patterns 218 are additionally formed around the gate pattern 212 to allow the gate pattern 212 to be formed with a uniform line width.

However, while the gate pattern 212 is formed in a long shape to be directly coupled to the connection pad 214 as shown in a pad connection region 'A' of FIG. 3, the dummy gate patterns 218 cannot be formed close to the connection pad 214. This is because all of the dummy gate patterns 218, the gate pattern 212 and the connection pad 214 are formed at substantially the same height, and thus a defect that the dummy gate patterns 218 are coupled to the connection pad 214 may occur in case of forming the dummy gate patterns 218 close to the connection pad 214. Therefore, it is difficult to insert the dummy gate patterns 218 and the gate pattern 212 in substantially the same length. When inserting the dummy gate patterns 218, it is difficult to uniformly maintain the line width of the gate pattern 212 in the pad connection region 'A' where the gate pattern 212 is coupled with the connection pad 214. In case the line width of the gate pattern 212 formed in the peripheral region is not uniform or the coupling between the connection pad 214 and the gate pattern 212 is damaged, the resistance increases. As a result, an operating speed may be reduced, or the operational stability may be deteriorated.

SUMMARY OF THE INVENTION

An embodiment of the present invention is directed to a semiconductor memory apparatus having a buried word line and a method for fabricating the same, capable of substantially preventing defects by increasing a processing margin when forming a gate pattern by forming a connection pad in an isolation layer under the gate pattern, wherein the connection pad is coupled to the gate pattern in a peripheral region.

In accordance with an embodiment of the present invention, a method for fabricating a semiconductor memory apparatus includes forming a connection pad in a peripheral region while forming a buried word line in a cell region, and forming a gate pattern in the peripheral region while forming a bit line in the cell region.

The method may further include forming an isolation layer in the cell region and the peripheral region to define an active region.

The connection pad may be formed in the isolation layer.

The gate pattern may be formed over the connection pad.

The forming of the connection pad in the peripheral region while forming the buried word line in the cell region may include forming a recess by etching the active region in the cell region and a trench by etching the isolation layer in the peripheral region, using mask defining positions of the buried word line and the connection pad, and filling the recess and the trench with a conductive material.

After the filling of the recess and the trench with the conductive material, the method may further include selectively exposing the cell region and the peripheral region using a cell open/close mask, thereby forming a resultant structure, and performing an etch-back process and a planarization process on the resultant structure.

The recess may be formed with a depth greater than that of the trench.

After forming the buried word line and the connection pad, the method may further include depositing an insulation layer in the cell region and the peripheral region.

The forming of the gate pattern in the peripheral region while forming the bit line in the cell region may include etching the insulation layer using mask defining positions of the bit line and the gate pattern, and filling a portion where the insulation layer is removed and the top surface of the active region is exposed with a conductive material.

When forming the gate pattern in the peripheral region, a dummy gate pattern electrically disconnected with the connection pad may be formed to have a length substantially the same as that of the gate pattern.

The method may further include forming contacts over the active region and the connection pad included in the peripheral region.

The contact formed over the connection pad may have a length substantially the same as that of the contact formed over the active region.

In accordance with another embodiment of the present invention, a semiconductor memory apparatus includes an isolation layer defining an active region in a cell region and a peripheral region, a buried word line and a gate line disposed in the cell region and the peripheral region, respectively, and a connection pad disposed in the isolation layer and coupled to the gate line.

The gate pattern may be disposed over the connection pad.

The semiconductor memory apparatus may further include a dummy gate line disposed in the peripheral region and having a length substantially the same as that of the gate line.

The semiconductor memory apparatus may further include a bit line arranged in a direction of crossing the buried word line in the cell region, and a plurality of contacts disposed over the connection pad and the active region included in the peripheral region.

The contact disposed over the connection pad may have a length substantially the same as the contact disposed over the active region.

BRIEF DESCRIPTION OF THE DRAWINGS

FIGS. 5a to 5d are cross-sectional views and a solid view illustrating the semiconductor memory apparatus fabricated using the masks described in FIGS. 4a and 4b, respectively.

DESCRIPTION OF SPECIFIC EMBODIMENTS

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

A method for fabricating a semiconductor memory apparatus in accordance with an embodiment of the present invention can reduce defects by increasing a processing margin when forming a transistor included in a peripheral region of the semiconductor memory apparatus including a buried word line in a cell region, for example. In the present application, there will be illustrated a semiconductor apparatus including a buried word line structure in a cell region and a plane transistor having a two-dimensional channel in a peripheral region.

Figure 4A:
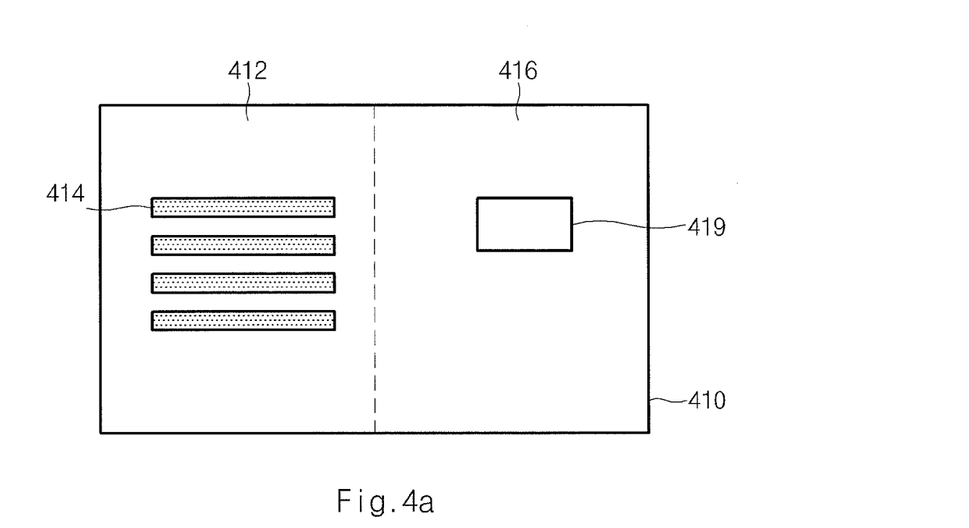
FIGS. 4a and 4b are plane views illustrating masks used in fabricating a semiconductor memory apparatus in accordance with an embodiment of the present invention.
Figure 4B:
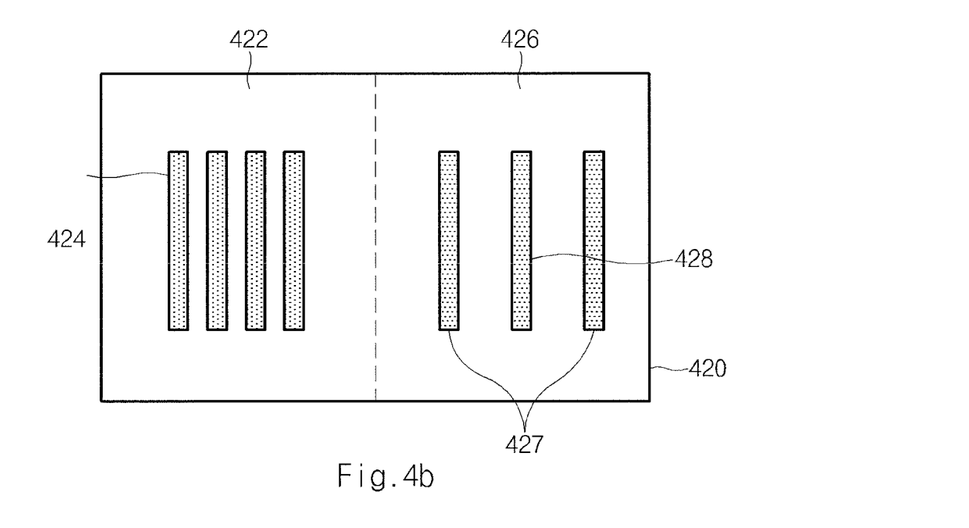

FIGS. 4a and 4b are plane views illustrating masks used in fabricating a semiconductor memory apparatus in accordance with an embodiment of the present invention.

Referring to FIG. 4a, a buried word line mask 410 includes a first region 412 to define a pattern to be formed in a cell region and a second region 416 to define a pattern to be formed in a peripheral region of the semiconductor memory apparatus. The first region 412 includes a plurality of line patterns 414 each of which defines a buried word line, and the second region 416 includes a pad pattern 419 defining a position of a connection pattern.

Although it is not shown, in the cell region, after forming an isolation region in a semiconductor substrate using a mask defining an active region, a recess (not shown) is formed in the active region using the buried word line mask 410, and then the buried word line is formed by filling the recess with a conductive material. Moreover, the connection pattern is made by forming a trench in the peripheral region and filling the trench with the conductive material. Herein, the recess is formed by etching a portion of the isolation region when forming the recess to form the buried word line in the cell region, and filled with the conductive material when filling the recess with the conductive material to form the buried word line. The recess is formed to have a depth greater than that of the trench. For instance, when the depth of the isolation region is about 3000 Å, the depth of the recess may be about 1200 Å considering a channel length of the buried word line. However, since a surface area is a more useful factor leading the increase of a processing margin than the depth of the trench considering the function of the connection pad, the depth of the trench is determined within 50% of the depth of the recess depending on a range of a processing margin when forming the trench.

Subsequently, an etch-back process of forming the buried word line or a planarization process of forming the connection pattern are independently performed in the cell region and the peripheral region, respectively, using a cell open/close mask.

Referring to FIG. 4b, a first region 422 of a bit line and gate pattern mask 420 includes line patterns 424 defining bit lines to be formed in the cell region, and a second region 426 includes a first line pattern 428 defining a gate pattern to be formed in the peripheral region and a second line pattern 427 defining a dummy gate pattern. That is, the bit line is formed in the cell region, and the gate pattern and the dummy gate pattern are formed in the peripheral region, using the bit line and gate pattern mask 420.

Unlike in the prior art, in accordance with the embodiment of the present invention, the first line pattern 428 for forming the gate pattern has a length substantially the same as that of the second line pattern 427 for forming the dummy gate pattern. Since the pad pattern 129 and the second line pattern 127 are defined in one mask in FIG. 1B, it is difficult to make the length of the second line pattern 127 substantially the same as that of the first line pattern 128 considering the design rule and the processing margin. However, since the pad pattern 419 and the first and second line patterns 428 and 427 are defined in different masks in accordance with the embodiment of the present invention, it is possible to form the connection pad and the dummy gate pattern at different heights on the semiconductor substrate and thus to form the second line pattern 427 defining the dummy gate pattern to have a length substantially the same as that of the first line pattern 428 defining the gate pattern.

FIGS. 5a to 5d are cross-sectional views and a solid view illustrating the semiconductor memory apparatus fabricated using the masks described in FIGS. 4a and 4b, respectively.

Figure 5A:
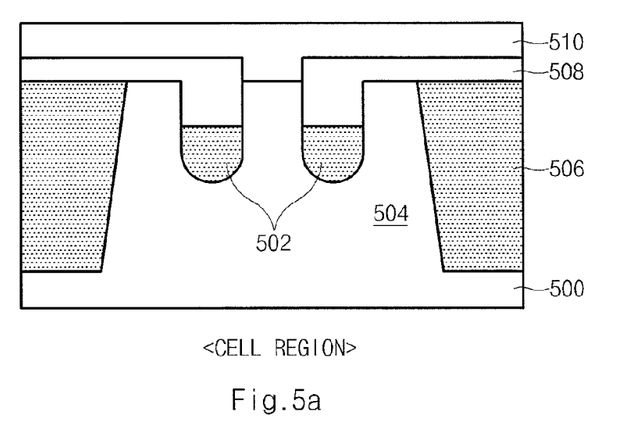
Figure 5B:
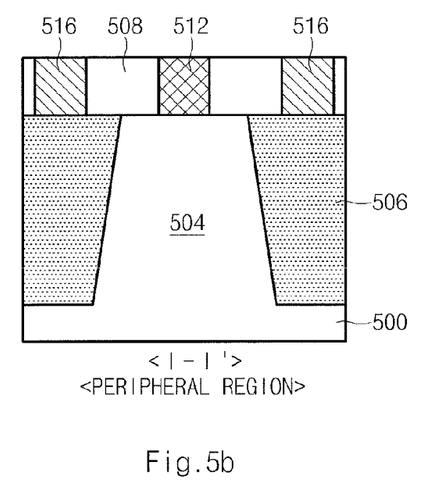
Figure 5C:
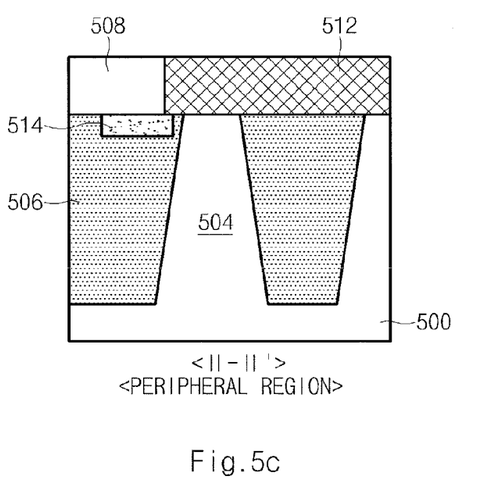

Referring to FIGS. 5a to 5c, in the cell region of the semiconductor memory apparatus, an isolation layer 506 defining an active region 504 is formed in a semiconductor substrate 500, and buried word lines 502 are formed in two recesses that are formed in the active region 504 using the buried word line mask 410. After forming an insulation layer 508 on the buried word lines 502 and the active region 504, a bit line 510 is formed to be partially coupled to the active region 504 by etching a portion of the insulation layer 508 to partially expose the top surface of the active region 504.

Figure 5D:
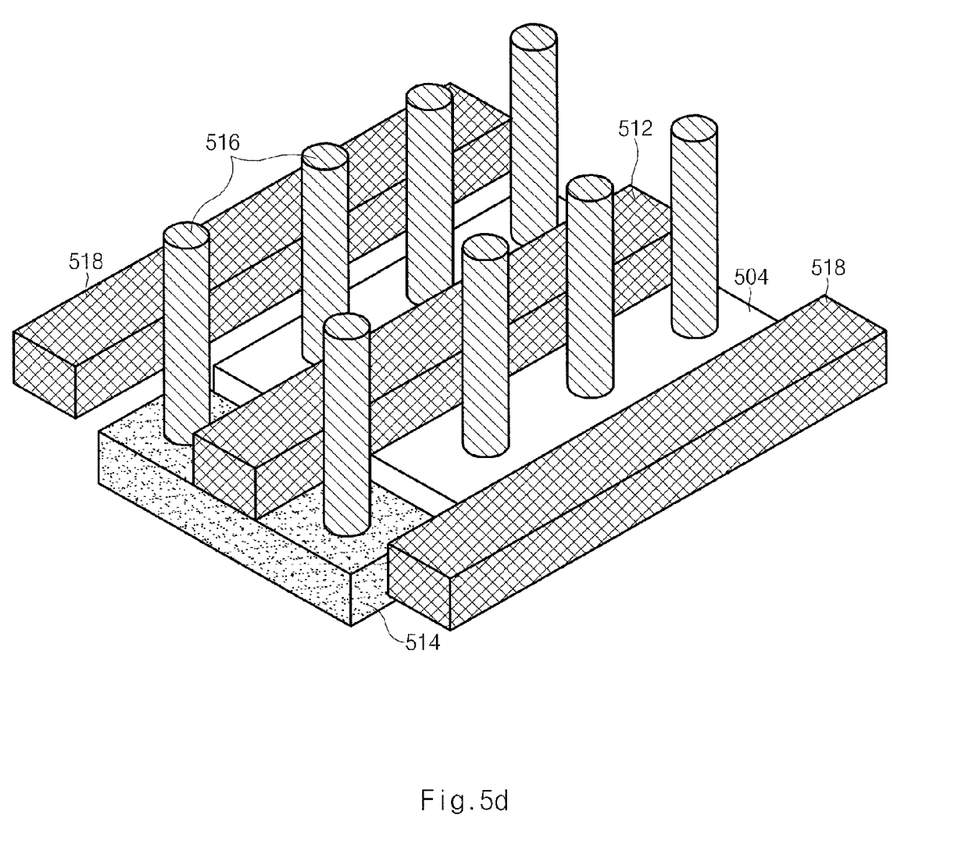

In the meantime, although the isolation layer 506 is also formed in the peripheral region of the semiconductor memory apparatus as in the cell region, a gate pattern 512, not the buried word line 502, is formed on the active region 504 of the peripheral region. Referring to FIG. 5b illustrating a cross-sectional view of the gate pattern 512 in a minor axial direction, i.e., a cross-sectional view taken along an I-I' line, the gate pattern 512 is formed on a two-dimensional plane channel region, and a dummy gate pattern 518 shown in FIG. 5d is formed on the isolation layer 506 in the peripheral region, whereas the buried word line 502 is formed on a three-dimensional channel region in the cell region. Unlike in the prior art, referring to FIG. 5c illustrating a cross-sectional view of the gate pattern 512 in a major axial direction, i.e., a cross-sectional view taken along an II-II' line, a connection pad 514 coupled to an end of the gate pattern 512 is formed at a position lower than that of the gate pattern 512, especially, in the isolation layer 506.

FIG. 5d is the solid view illustrating a transistor included in the peripheral region of the semiconductor memory apparatus. The active region 504 defined by the isolation layer 506 described in FIG. 5a has an island shape. The gate pattern 512 is formed on the active region 504, and the connection pad 514 is formed beneath one edge of the gate pattern 512 to transfer a gate voltage. At this time, the gate pattern 512 formed using the bit line and gate pattern mask 420 is disposed on the connection pad 514 formed using the buried word line mask 410. Unlike the conventional single pattern in the 'T' shape, the pad pattern 514 having a tetragonal shape and the gate pattern 512 having a line shape are separately formed and then coupled to each other. Since the connection pad 514 and the active region 504 should be a certain distance apart to suppress the generation of the parasitic capacitance and the electrical short, the gate pattern 512 should be formed extending onto the isolation layer 506 as well as onto the active region 504. Subsequently, a plurality of contacts 516 is formed on the active region 504 and the connection pad 514 to transmit signals and data, or to supply the gate voltage.

Particularly looking at a process of forming the contacts 516, after depositing an inter-layer insulation layer (not shown) on the gate pattern 512, the active region 504 and the connection pad 514, contact holes (not shown) are formed and filled with a conductive material. Unlike in the prior art, in accordance with an embodiment of the present invention, since a contact hole formed on the connection pad 514 has a depth substantially the same as that of a contact hole formed on the active region 504, there is no difference in the processing margins when forming the contact holes, and thus the contact holes can have lower portions having an uniform size, for example. Therefore, in accordance with an embodiment of the present invention, it is possible to make lengths of the contracts 516 formed on the active region 504 and the connection pad 514 constant, and to substantially prevent contact resistance between the contact 516 and the active region 504 or the connection pad 514 from increasing as a result of the difference of the processing margins, for example.

Figure 6:
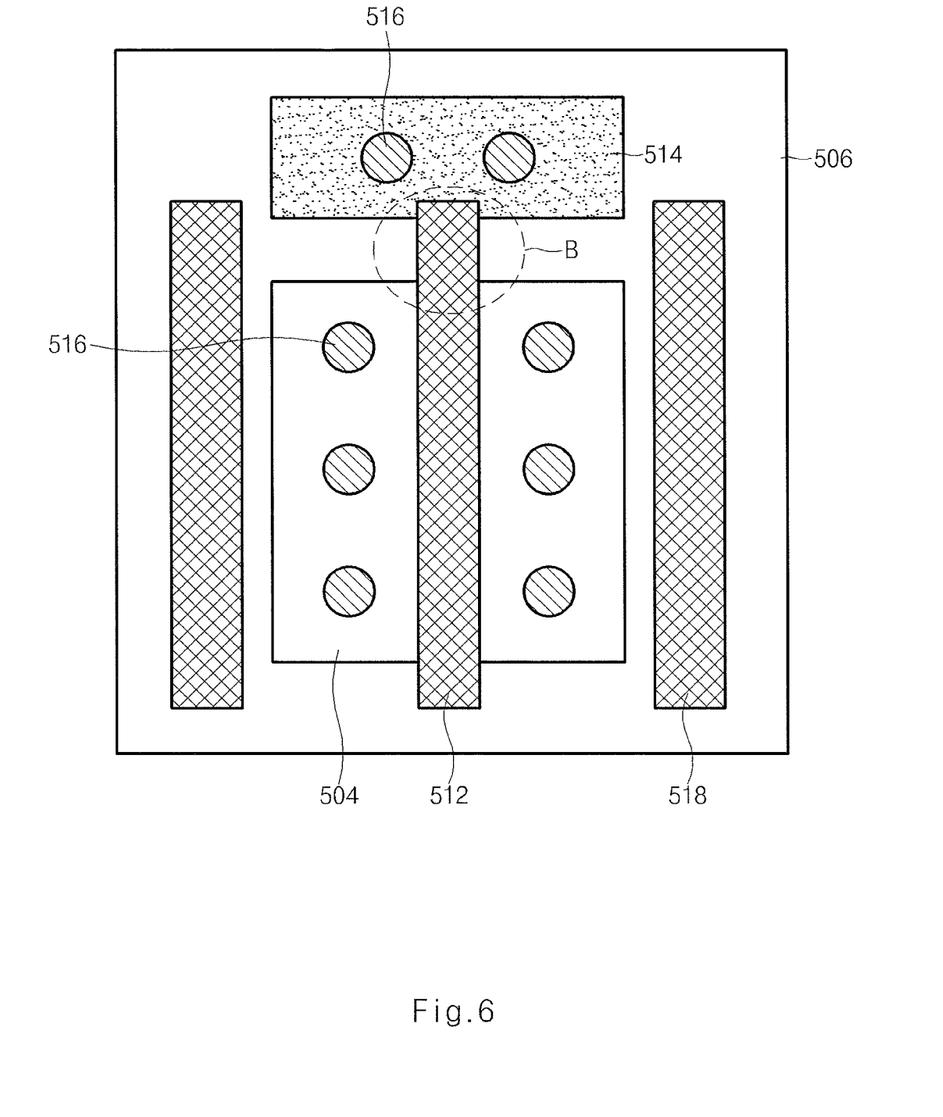
FIG. 6 is a plane view illustrating a transistor described in FIG. 5d.

FIG. 6 is a plane view illustrating the transistor described in FIG. 5d.

Referring to FIG. 6, the active region 504 is defined by the isolation layer 506, the gate pattern 512 is formed on the active region 504, and the connection pad 514 is formed in the isolation layer 506. Moreover, the plurality of contacts 516 is formed on the active region 504 and the connection pad 514. The dummy gate patterns 518 are further included in the semiconductor memory apparatus to allow the gate pattern 512 to be formed with a uniform line width since the line width and the processing margin of the gate pattern 512 formed in the peripheral region are reduced as the design rule decreases recently.

In the pad connection region 'A' described in FIG. 3, the dummy gate patterns 218 are formed to have a length smaller than that of the gate pattern 212, and thus there occurs a drawback that the line width of the gate pattern 212 is not uniform. However, in accordance with an embodiment of the present invention, as shown in a pad connection region 'B' described in FIG. 6, the gate pattern 512 has a length substantially the same as those of the dummy gate patterns 518 and thus is formed with the uniform line width in the pad connection region 'B'.

Unlike in the prior art, in accordance with an embodiment of the present invention, the dummy gate patterns 518 can be formed close to the connection pad 514. This is because the dummy gate patterns 518 and the gate pattern 512 are formed at positions higher than that of the connection pad 514, and thus the possibility of the occurrance of the defect that the dummy gate patterns 518 are coupled with the connection pad 514 is substantially reduced, although the dummy gate patterns 518 are formed close to the connection pad 514. Therefore, it is possible to insert the dummy gate patterns 518 in the same length as that of the gate pattern 512. When inserting the dummy gate patterns 518, it is possible to uniformly form the line width of the gate pattern 512 in the pad connection region 'B' where the gate pattern 512 is coupled with the connection pad 514. As a result, while the line width at the end of the gate pattern 212 formed in the peripheral region is not uniform or the coupling between the connection pad 214 and the gate pattern 212 is damaged in the prior art, in accordance with an embodiment of the present invention, it is possible to uniformly maintain the line width of the gate pattern 512 and thus to minimize the increase of the resistance and the deterioration of the operational stability and the operating speed.

As described above, in a method for fabricating the semiconductor memory apparatus in accordance with an embodiment of the present invention, the isolation layer is formed in the cell region and the peripheral region of the semiconductor memory apparatus to define the active region. For instance, it is possible to form the active region by performing a shallow trench isolation (STI) process to fill a trench with an insulating material after forming the trench by etching a portion of the semiconductor substrate. Subsequently, the method for fabricating the semiconductor memory apparatus includes forming the connection pad in the peripheral region while forming the buried word line in the cell region and forming the gate pattern in the peripheral region while forming the bit line in the cell region, for example. That is, the buried word line and the connection pad are formed using a single mask, and the bit line and the gate pattern are formed using another single mask. The semiconductor memory apparatus fabricated by the above method includes the isolation layer defining the active region in the cell region and the peripheral region, the buried word line and the gate line formed in the cell region and the peripheral region respectively, and the connection pad formed in the isolation layer and coupled to a gate line.

In accordance with an embodiment of the present invention, it is possible to sufficiently secure the processing margin when forming the gate pattern by forming the connection pad in the peripheral region when forming the buried word line in the cell region, and forming the gate pattern in the peripheral region when forming the bit line in the cell region of the semiconductor memory apparatus, for example.

Furthermore, in accordance with an embodiment of the present invention, it is possible to secure the processing margin when forming the gate pattern in the peripheral region by changing only the order in which the connection pad is formed without adding a separate process to the conventional process, and thus defects that may be generated in the process of fabricating the semiconductor memory apparatus are substantially reduced, for example.

Moreover, in accordance with an embodiment of the present invention, since the depths of the contact holes for forming the contacts on the active region and the connection pad are substantially the same, the increase of contact resistance between the active region and the contacts can be substantially prevented, for example.

While the present invention has been described with respect to specific embodiments, it will be apparent to those skilled in the art that various changes and modifications may be made without departing from the spirit and scope of the invention as defined in the following claims.

What is claimed is:

1. A semiconductor memory apparatus, comprising:
   an isolation layer defining an active region in a cell region and a peripheral region;
   a buried word line and a gate line disposed in the cell region and the peripheral region respectively; and
   a connection pad disposed inside the isolation layer and coupled to the gate line.

2. The semiconductor memory apparatus of claim 1, wherein a gate pattern is disposed over the connection pad.

3. The semiconductor memory apparatus of claim 1, further comprising a dummy gate line disposed in the peripheral region and having a length substantially the same as that of the gate line.

4. The semiconductor memory apparatus of claim 1, further comprising:
   a bit line arranged in a direction of crossing the buried word line in the cell region; and
   a plurality of contacts disposed over the connection pad and the active region included in the peripheral region.

5. The semiconductor memory apparatus of claim 4, wherein a contact disposed over the connection pad has a length substantially the same as a contact disposed over the active region.

\* \* \* \* \*